United States Patent [19]

Sunshine

[11] 3,728,591

[45] Apr. 17, 1973

[54] GATE PROTECTIVE DEVICE FOR INSULATED GATE FIELD-EFFECT TRANSISTORS

[75] Inventor: Richard Alan Sunshine, Hightstown, N.J.

[73] Assignee: RCA Corporation, New York, N.Y.

[22] Filed: Sept. 3, 1971

[21] Appl. No.: 177,790

[52] U.S. Cl. .........317/235 R, 317/235 B, 317/234 T, 317/235 G, 317/235 T

[51] Int. Cl. ..........H01l 11/14

[58] Field of Search ..........317/234 S, 234 T, 317/235 B, 235 G, 235 F, 235 AM, 234 W, 235 T

[56] References Cited

UNITED STATES PATENTS

| | | | |
|---|---|---|---|
| 3,469,155 | 9/1969 | Van Beek | 317/235 |
| 3,470,390 | 9/1969 | Lin | 307/237 |
| 3,636,418 | 1/1972 | Burns | 317/234 R |
| 3,567,508 | 3/1971 | Cox et al. | 117/212 |

OTHER PUBLICATIONS

Zuleeg, Electronics, Mar. 20, 1967, pp. 106–108.

*Primary Examiner*—Martin H. Edlow
*Attorney*—G. H. Bruestle

[57] ABSTRACT

The protective device comprises a thin film of semiconductor material on an insulating substrate, contiguous regions of the film being of opposite conductivity type and providing a plurality of serially connected diodes in back-to-back relationship. Disposed on the surface of various different ones of the regions are layers of metal for reducing the electrical resistance of the device. The device is connected between the gate electrode of the transistor to be protected and either the source or drain electrode thereof.

6 Claims, 9 Drawing Figures

INVENTOR.
Richard A. Sunshine
BY M.Y. Epstein
ATTORNEY

PRIOR ART

INVENTOR.
Richard A. Sunshine
BY M. Y. Epstein
ATTORNEY

INVENTOR.
Richard A. Sunshine
BY M.Y. Epstein
ATTORNEY

GATE PROTECTIVE DEVICE FOR INSULATED GATE FIELD-EFFECT TRANSISTORS

This invention was made in the course of or under a contract or subcontract thereunder with the National Aeronautics and Space Administration.

BACKGROUND OF THE INVENTION

This invention relates to semiconductor devices, and particularly to semiconductor devices known as insulated gate field-effect transistors. The invention has particular utility with, but is not limited to, field-effect transistors fabricated in thin films of semiconductor material.

Insulated gate field-effect transistors (IGFETs) are well known and comprise source and drain regions of one type of conductivity semiconductor material separated by a channel region of the opposite type of conductivity material. Electrodes are provided in direct contact with each of the source and drain regions, and a gate electrode is provided overlying the channel region but separated therefrom by a relatively thin layer of a dielectric material.

One problem associated with such devices is that frequently, during handling thereof, a static electric voltage is developed between the gate electrode and the channel region which causes voltage breakdown of the gate insulating layer and damage to the device.

To protect the IGFETs from such damage, various circuit means have been devised. Generally, these means comprise low voltage breakdown devices connected between the gate electrode and the channel region of the IGFET, whereby the static voltage is discharged through the device substrate along paths other than through the gate insulating layer.

One recently devised protective device, especially useful to protect IGFETs formed in thin films of semiconductor material, comprises a row of diodes connected together in back-to-back relation within a thin film of semiconductor material. This device, as is described more fully hereinafter, has a relatively large current discharging capacity, and has the same breakdown voltage for either polarity of voltage impressed thereacross.

A problem encountered with this thin film protective device is that occasionally, owing to various reasons, such as the presence of a defect in the semiconductor material at a junction of the device, a small portion of the junction is particularly susceptible to being driven into "second breakdown" when the device is operated. That is, during device operation and the passage of a current therethrough, the electrical resistance of the "-defective" portion of the junction abruptly decreases, whereby substantially all the current through the junction is channeled into and through the second breakdown portion. This results in the formation of a hot spot at this portion which can damage the junction. Even more important, however, is that the second breakdown at the one junction is quite likely to spread to other junctions containing no such defects and damage these junctions. Thus, while it frequently occurs that a second breakdown of a single junction of devices of the type herein described does not significantly impair the usefulness of the device for its intended function, a spread of the second breakdown phenomenon from the one defective junction to other junctions does destroy the utility of the device. Thus, in addition to the need for preventing second breakdown at any single junction, a need exists for preventing the spread of the second breakdown from junction to junction when it does occur.

DESCRIPTION OF THE PREFERRED EMBODIMENTS

Figure 1:
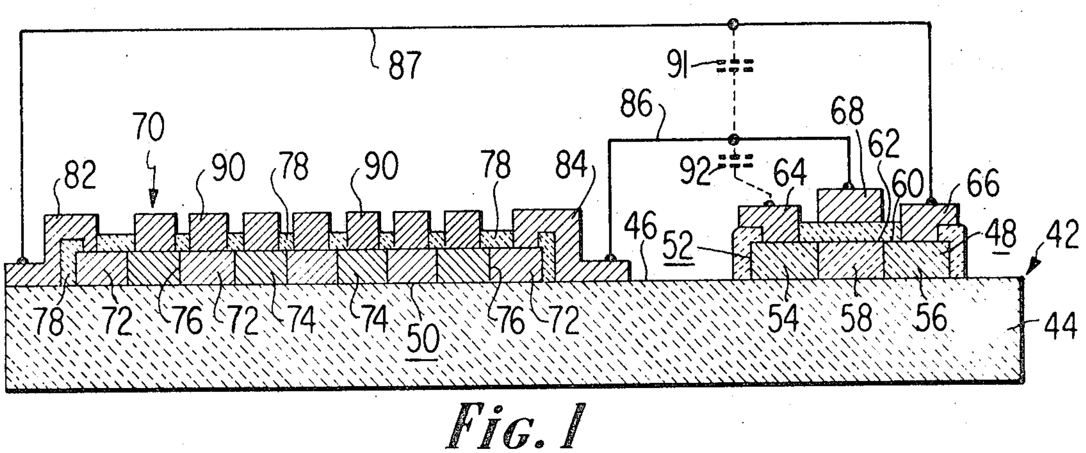
FIG. 1 is a view, in cross-section, and partly schematic, of a device made in accordance with the instant invention.

An example of a device 42 including a thin film, insulated gate field-effect transistor and a protective means for the transistor in accordance with the invention is shown in FIG. 1. The device 42 comprises a substrate 44 of a crystalline insulating material, e.g., sapphire, spinel, or the like. Disposed on one surface 46 of the substrate 44 are two spaced apart thin films 48 and 50, e.g., in the order of 10,000 A thick, of a semiconductor material, e.g., silicon. A field-effect transistor 52 is disposed within the film 48 and comprises a source region 54 and a drain region 56, both of P conductivity, and a channel region 58 of N conductivity. Covering the surface 60 of the semiconductor material film 48 is a layer 62 of a dielectric material, e.g., silicon dioxide, having a thickness in the order of 1,000 A. Source and drain electrodes 64 and 66, respectively, are provided on the surface of the layer 62 and make contact with their respective regions through openings through the layer 62. A gate electrode 68 is provided on the dielectric layer 62 overlying the channel region 58. The electrodes 64, 66, and 68 can be of any number of conductive materials, e.g., aluminum.

The protective device 70 for the transistor 52 is disposed within the film 50 and comprises a plurality of contiguous regions of semiconductor material of alternating conductivity, i.e., of opposite conductivity type. Thus, in the instant embodiment, five regions 72 of N conductivity are provided alternating with four regions 74 of P conductivity, each contiguous pair of regions 72 and 74 having a PN junction 76 therebetween and constituting a zener or avalanche diode. Owing to the alternation of the type of conductivity of the contiguous regions 72 and 74, adjacent diodes are of opposite polarity, i.e., the row of diodes are connected in "back-to-back" relation.

Overlying the film 50 is a layer 78 of a protective material, e.g., silicon dioxide. Conductive terminals 82 and 84, comprising layers of metal, e.g., aluminum, are provided in contact with the two end regions 72 of the device 70 through openings through the layer 78. One terminal 84 is electrically connected by means of a connector 86 to the gate electrode 68 of the transistor 52, and the other terminal 82 is electrically connected by means of a connector 87 to either the source or drain electrode of the transistor, the drain electrode 66 in this embodiment. The two connectors 86 and 87 are shown schematically, the provision of such connectors being well known in these arts.

To the extent so far described, the protective device 70 is known. To improve the reliability of the device 70, in a manner described hereinafter, layers 90 of an electrically conductive material e.g., aluminum, tungsten, or the like, are disposed directly on top of a portion of each region 72 and 74. Preferably, the layers 90 cover substantially the entire upper surface of each region 72 and 74 (see, also, FIG. 6), the layers 90 being separated from one another, however, in order not to short out the junctions 76 between the regions 72 and 74. The electrical conductivity of the layers 90 is greater than that of the regions 70 and 72 and preferably, for reasons described hereinafter, is as high as possible.

The operation of the device 70 is described hereinafter.

In the fabrication of the device shown in FIG. 1, a thin film 48–50 (FIG. 2) of silicon is first epitaxially deposited on the substrate 44. Because the channel region 58 of the transistor 52 (FIG. 1) in this embodiment of the invention is of N conductivity, the film 48–50 is preferably of this conductivity as deposited. Means for epitaxially depositing doped layers of semiconductor material on crystalline insulators are known. The film 48–50 has a relatively high resistance, in the order of 100,000 ohms per square, in order to provide the transistor 52 with certain desired electrical characteristics, e.g., low threshold voltage.

Figure 3:
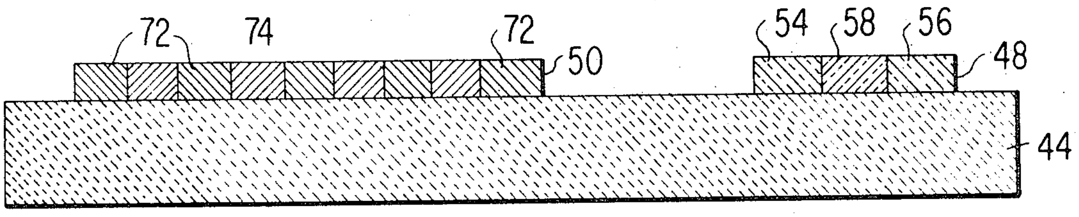
FIGS. 3 and 4 are views similar to that of FIG. 2 but showing the workpiece at successive steps in the fabrication of the workpiece shown in FIG. 1.

Thereafter, using known masking and etching techniques, the film 48–50 is defined to provide the two spaced apart films 48 and 50 (FIG. 3). Then the various regions of what are to become the transistor 52 and the protective device 70 are formed. The source and drain regions 54 and 56 of the transistor can be formed, for example, by providing a diffusion mask (not shown) over a central portion of the film 48 and diffusing P conductivity modifiers, e.g., boron, into the unmasked portions of the film 48. The portion of the film 48 beneath the diffusion mask, between the source and drain regions 54 and 56, is the channel region 58. The source and drain regions 54 and 56, in this embodiment, are doped to a resistance of 90 ohms per square.

Known masking and diffusing processes can likewise be used to convert portions of the film 50, of N conductivity as deposited, to the P conductivity regions 74, and also, to increase the conductivity of the material forming the N conductivity regions 72. In this embodiment, for example, the N and P conductivity regions 72 and 74 of the device 70 are doped to the degenerate level, i.e., to doping concentrations of greater than $5 \times 10^{19}$ atoms/cm$^3$.

Figure 4:
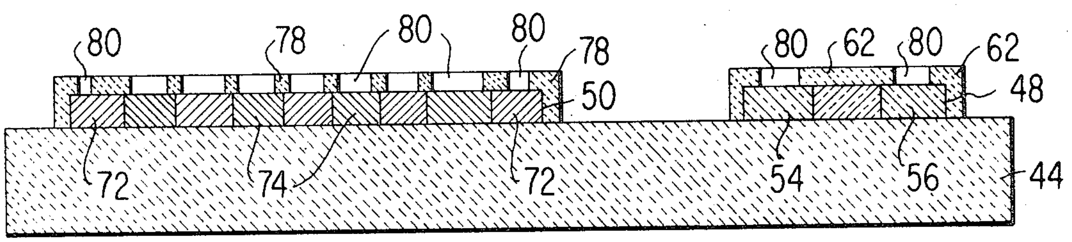

Thereafter, the dielectric layer 62 (FIG. 4) on the film 48 and the protective layer 78 on the film 50 are provided. Using films 48 and 50 of silicon, layers 62 and 78 of silicon dioxide can be provided most conveniently by thermally oxidizing surface layers of the films 48 and 50 in known manner. Then, openings 80 are made through the layers 62 and 78, using known masking and etching processes, to expose a surface portion of the source region 54 and the drain region 56 of the transistor 52, and surface portions of each of the regions 72 and 74 of the protective device 70. A layer of metal is then deposited on the workpiece and into contact with the exposed surface portions of the various regions, and the metal layer is thereafter defined, using known photolithographic techniques, to provide (FIG. 1) the source electrode 64, drain electrode 66, and gate 68 electrode, the two terminals 82 and 84 for the protective device 70, and the various layers 90 therefore. Also, while not shown, except schematically, the contacts 86 and 87 are also defined in the metal layer to connect the terminals 82 and 84 with the drain electrode 66 and the gate electrode 68, respectively, of the transistor 52.

The protective device 70 operates as follows. Each diode of the device 70, owing to the degenerate doping of the regions 72 and 74 forming the diodes, has a forward conducting voltage of about 0.7 volt and a reverse or zener breakdown voltage of about 6 volts. Thus, for the embodiment shown, comprising eight diodes, for a given voltage of either polarity between the terminals 82 and 84 of the protective device 70, four of the diodes are biased in the forward direction, and four of the diodes are biased in the reverse direction. The breakdown voltage of the device 70, in either direction, is thus four times 0.7 volt + four times 6 volts, or about 27 volts. This voltage is less than the gate dielectric layer 62 breakdown voltage, of about 70 volts. Also, the breakdown voltage of the device 70 is considerably higher than the signal voltages usually applied to the gate electrode 68 of the transistor, in the order of 20 volts maximum, in the operation thereof.

Figure 2:
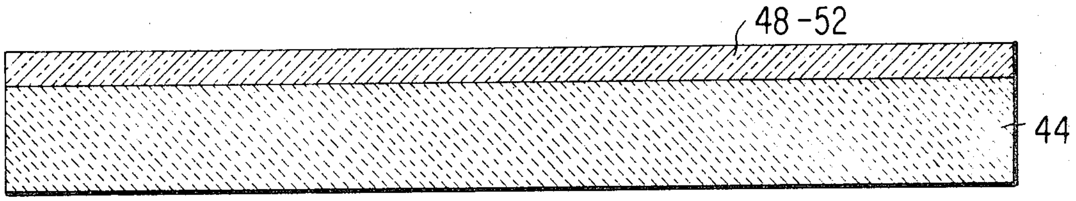
FIG. 2 is a view in cross-section of a workpiece used in the fabrication of the device shown in FIG. 1.

If, during handling of the device 42, a static voltage, represented by the capacitor 91 shown in dashed lines in FIG. 2 (the electrical equivalent of, for example, an ungrounded human operator handling the device and touching certain terminals thereof), is impressed on the transistor 52 between the gate electrode 68 and the drain electrode 66 thereof, a discharge path is provided from one plate of the capacitor 91 through the connector 86, through the protector device 70, and through the connector 87 back to the other plate of the capacitor. Thus, the capacitor is discharged in a path not including the gate insulator layer 60, thereby protecting the transistor 52 against damage.

It is noted that if a static voltage, represented by the capacitor 92, is impressed on the transistor 52 between the source electrode 64 and the drain electrode 68, the discharge path is from one plate of the capacitor 92 through the connector 86, through the protective device 70, through the connector 87 to the drain electrode 66, through the body of the transistor 52 via the drain 56, channel 58, and source 54 regions thereof to the source electrode 64, and thence to the other plate of the capacitor. Again, a path including the gate insulating layer 62 is avoided, thereby preventing breakdown of this layer.

In the above-described situation, in which the discharge of the static charge occurs through the body of the transistor 52, the current passes through two p-n junctions, one of which is reverse biased with respect to the direction of current flow. While, theoretically, this can cause damage to the transistor, in actual tests using the protective arrangement shown in FIG. 1, no such damage has been detected. In any event, by providing an additional and separate protective device 70 (not shown) on the substrate 44 connected between the gate electrode 68 and the source electrode 64, discharge of currents through the body of the transistor is avoided.

As previously noted, each of the regions 72 and 74 of the device 70 is heavily doped. Accordingly, the resistance of these regions is relatively low with the result that relatively large currents can be handled by the device 70 without overheating and damage thereto. Also, as described more fully below, the presence of the conductive layers 90 further reduces the resistance of the device and further increases the current handling capability thereof.

Protective devices 70 having different breakdown voltages and different current handling capabilities can be provided by varying the number of diodes in the devices. Also, the current handling capacity can be increased by increasing the cross-sectional area of the diodes. Preferably, however, to conserve substrate space for tighter packing together of various components on single substrates, and to reduce the cost of the overall device 42, the film 50 in which the device 70 is formed is as small as possible.

Other materials for the various components of the device 42 can be used, the selection of such materials being a matter of choice to persons skilled in these arts.

The functions of the conductive layers 90 are now described.

As previously noted, a problem encountered with prior art breakdown devices of the type similar to the device 70 illustrated herein, but not including the conductive layers 90, is that if a second breakdown occurs at one junction of the device, owing to a "weakness" or defect at such one junction, second breakdowns are frequently induced at other junctions not containing such defects. Based upon investigations by myself, a possible reason for the spread of the second breakdown phenomenon is explained in connection with FIG. 5.

Figure 5:
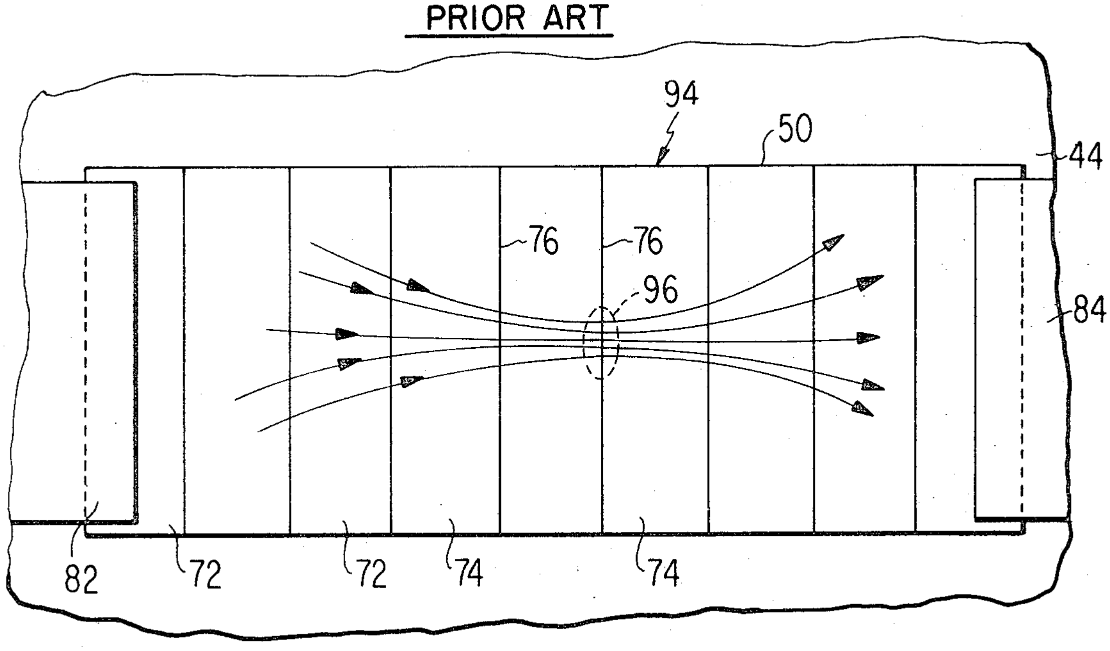
FIG. 5 is a plan view of a prior art protective device.

The device 94 shown in FIG. 5 is a protective device quite similar to the protective device 70 described above but not including the conductive layers 90. For purpose of explanation, it is assumed that a region 96 (designated by dashed lines) of the device 94 at one of the device junctions 76 is defective in some manner and is thus readily subject to second breakdown during operation of the device. It is further assumed that the other junctions of the device contain no such defects and are thus not subject, when operated within rated conditions, to second breakdown.

While long recognized, the phenomenon of junction second breakdown is not fully understood. A paper discussing this phenomenon, entitled "Stroboscopic Investigation of Thermal Switching In An Avalanching Diode" appears in Applied Physics Letters, Vol. 18, No. 10, pgs. 468–470 (May 15, 1971). In general, second breakdown is characterized by a sharp reduction in electrical resistance at the affected region, with the result that the current passing through the junction, normally at a relatively uniform density across the entire extent of the junction, is sharply channeled through a small portion of the junction at the breakdown region, thus providing a high current density at this region. The high current density generates high electrical resistance heating which frequently results in permanent damage to the device, at least in the region of the second breakdown.

I discovered that a further effect of the second breakdown, with respect to devices of the type herein described, is that owing to the channeling of the current through a small portion of the junction subjected to second breakdown, as shown by the arrowed lines in FIG. 5, the current paths through the remainder of the device likewise tend to be constricted or bunched together. That is, although the current paths tend to converge towards the breakdown region 96 and diverge therefrom as shown, the rates of convergence and divergence of the current paths are not sufficiently high to avoid the presence of unusually high current densities at the junctions closest to the second breakdown junction. These high current densities, higher than those for which the device is designed, thus drive these otherwise "sound" junctions into second breakdown. Thus, although the device 94, as fabricated, may contain but one defective junction, the failure of the one defective junction generally results in the failure of several junctions.

Figure 6:
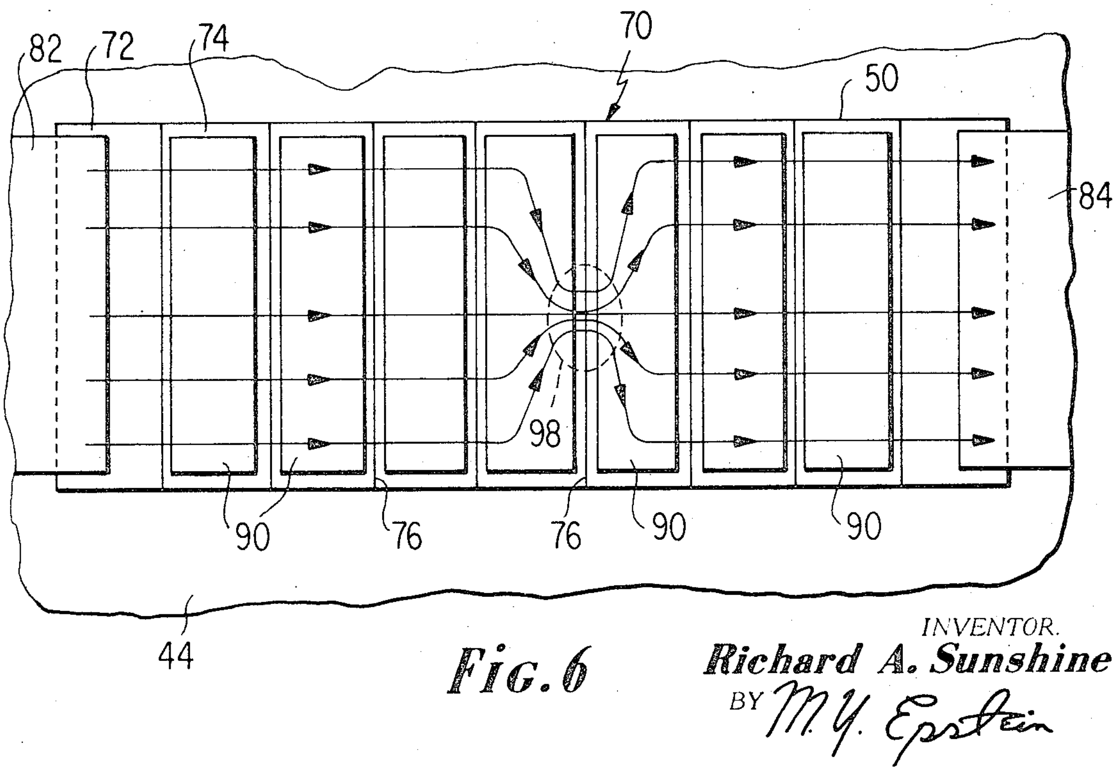
FIG. 6 is a view similar to that of FIG. 5 but showing a device according to the instant invention.

One function of the conductive layers 90, in accordance with the instant invention, is to "decouple" the various junctions of the protective device from one another with respect to the current path constrictions caused by a second breakdown in one junction. As shown in FIG. 6, owing to the presence of the highly conductive layers 90, the rate of convergence of the current paths towards, and the rate of divergence of the current paths away from a region 98 of second breakdown are so great as to provide a very short region of the device in which current crowding or constriction occurs. Thus, the current densities at junctions adjacent to the second breakdown junction are not increased, and these junctions, if sound, are not driven into second breakdown. The rates of convergence and divergence of the current paths are a function of the electrical conductivity of the layers 90 as well as, of course, the electrical conductivities of the various regions 72 and 74. In the prior art protective devices, such as the device 94 shown in FIG. 5, the electrical conductivities of the various doped regions thereof are not sufficient to provide adequately high rates of convergence and divergence of the current paths to avoid the triggering of second breakdowns in adjacent junctions. Also, it was not recognized in the past that such high rates of convergence and divergence of the current paths are necessary to avoid this problem.

A further advantage of the conductive layers 90 is that they provide parallel paths of low resistance for the current through the protective device, thereby reducing the electrical resistance heating of the devices and thus reducing the likelihood of the occurrence of a second breakdown.

Additionally, owing to the reduction of the electrical resistance of the protective device afforded by the conductive layers 90, it is feasible to increase the lengths of the various regions 72 and 74 of the device, in comparison with the prior art devices, without increasing the resistance of the device. Increased distance between the junctions 76 of the device is desired to reduce the thermal coupling therebetween, thereby further decreasing the likelihood of the occurrence of or the spreading of second breakdowns.

The greater the size of the conductive layers 90 relative to the size of the regions 72 and 74 the more effective are the layers 90 in improving the reliability of the protective devices. A limitation on the size of the conductive layers 90, however, is that they must not be so close to one another as to cause shorting out of the junctions 76 between the regions 72 and 74.

Figure 7:
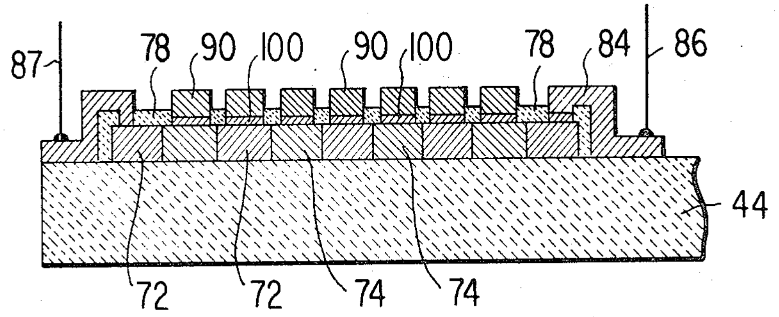
FIGS. 7, 8, and 9 are cross-sectional views showing different embodiments of the invention.

Additionally, in order to reduce the likelihood of excessive heating of the conductive layers 90 if a second breakdown does occur at one of the junctions 76, it is sometimes preferable (with an exception described below) to provide at least some minimum spacing between the layers 90 and the junctions 76. A reason for this is that second breakdowns are not necessarily permanently harmful or destructive of the junctions at which they occur. That is, in some instances, the junctions completely recover, or are only slightly damaged. If, however, excessive heating of one or more of the layers 90 occurred as a result of such second breakdown, permanent damage to the device could result owing to, for example, the inducement of an adverse metallurgical reaction between the layers 90 and the underlying semiconductor film. The problem of overheating of the layers 90 can be reduced, and the spacing between the layers 90 and the junctions 76 accordingly reduced, by using metals which are less sensitive to such problems caused by high temperatures. Thus, for example, a metal such as tungsten can be used for the layers 90. Alternately, when aluminum is used for the layers 90, by disposing a layer 100 (FIG. 7) of a "masking" material, such as titanium (with a thickness in the order of 1,000 A) between the layers 90 and the silicon film 50, adverse metallurgical reactions between the aluminum and the silicon are prevented. The use of such masking layers is known.

In the embodiment above described, utilizing aluminum for the conductive layers 90, the layers 90 have a thickness of 5,000 A, a length in the direction between junctions 76 of 0.4 mil, and a width of 6 mils. The spacing between the layers 90 and the junctions 76 is in the order of 0.4 mil. The regions 72 and 74 have a length of 1.2 mils and a width of 6 mils. Peak to peak currents of as high as two amperes have been discharged through devices of the type above-described without damage thereto.

Figure 8:
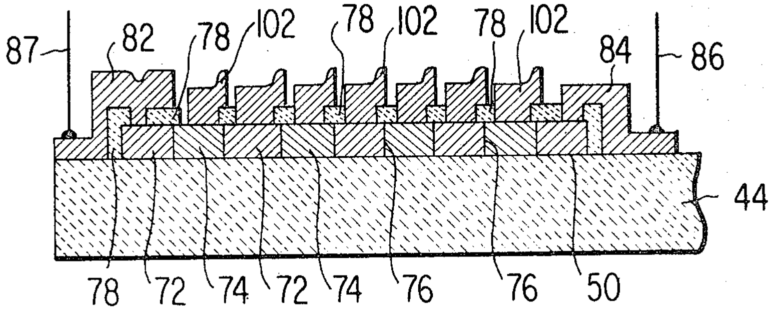

Although it is necessary to space the various layers 90 from one another to prevent shorting out of the junctions 76 between the regions 72 and 74, in one embodiment, as shown in FIG. 8, conductive layers 102 are disposed to overlie the various junctions 76, the insulating layers 78 being disposed between the layers 102 and the film 50 at the junctions. An advantage of this arrangement is that the presence of the highly conductive layers 102 overlying the surface intercepts of the p-n junctions tends to reduce the amount of leakage current across the junctions.

Figure 9:
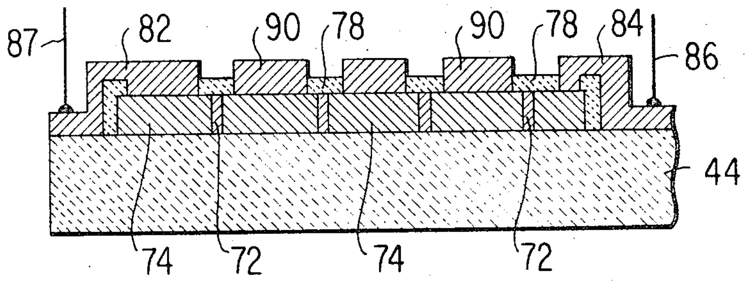

In another embodiment, as shown in FIG. 9, the regions 72 and 74, preferably the *n* type regions 72, as shown, are made as short, in the direction between the junctions 76, as possible. An advantage of this is that the over-all resistance of the protective device is minimized. With the regions 72 having lengths as small as, e.g., 2 microns, the surface area of the regions 72 is so small as to render it quite difficult to provide conductive layers in contact therewith. Thus, in this embodiment, the conductive layers 90 are provided only on the large regions 74. The presence of the conductive layers 90, although only on alternate regions of the protective device, still improves the reliability thereof.

I claim:

1. A semiconductor device comprising:

a substrate and a thin film of semiconductor material on said substrate;

contiguous regions of said film being of opposite conductivity type providing a plurality of serially connected diodes; and electrically conductive means individually electrically connected to different ones only of said regions, and being otherwise electrically isolated, for reducing the electrical resistance presented by said ones of said regions to the flow of current from diode to diode of said device.

2. A device as in claim 1 wherein said means comprise a coating of metal.

3. A device as in claim 2 wherein said contiguous regions each extend through the entire thickness of said film, and said metal coatings are disposed on a surface of said film.

4. A device as in claim 3 wherein said coatings each comprise a combination of a layer of titanium disposed directly in contact with said semiconductor film and a layer of aluminum disposed on top of said titanium layer.

5. A device as in claim 3 including layers of insulating material on said surface overlying the boundaries between said regions, said metal coatings overlying said layers at said boundaries.

6. A device as in claim 1 including an insulated gate field effect transistor disposed on said substrate and comprising source, gate, and drain electrodes, and wherein said diodes are connected in back-to-back relation and are connected serially between said gate electrode and one of said source and drain electrodes.

* * * * *